US011646200B2

(12) United States Patent
Witters et al.

(10) Patent No.: US 11,646,200 B2
(45) Date of Patent: May 9, 2023

(54) INTEGRATION OF A III-V CONSTRUCTION ON A GROUP IV SUBSTRATE

(71) Applicant: IMEC VZW, Leuven (BE)

(72) Inventors: Liesbeth Witters, Lubbeek (BE); Niamh Waldron, Heverlee (BE); Amey Mahadev Walke, Heverlee (BE); Bernardette Kunert, Wilsele (BE); Yves Mols, Wijnegem (BE)

(73) Assignee: IMEC VZW, Leuven (BE)

( * ) Notice: Subject to any disclaimer, the term of this patent is extended or adjusted under 35 U.S.C. 154(b) by 38 days.

(21) Appl. No.: 17/323,540

(22) Filed: May 18, 2021

(65) Prior Publication Data

US 2021/0358748 A1 Nov. 18, 2021

(30) Foreign Application Priority Data

May 18, 2020 (EP) .................................... 20175230

(51) Int. Cl.
*H01L 21/02* (2006.01)
*H01L 29/267* (2006.01)
(Continued)

(52) U.S. Cl.
CPC .. *H01L 21/02395* (2013.01); *H01L 21/02381* (2013.01); *H01L 21/02389* (2013.01);
(Continued)

(58) Field of Classification Search
None
See application file for complete search history.

(56) References Cited

U.S. PATENT DOCUMENTS 9,917,060 B1 * 3/2018 Gluschenkov .............................. H01L 21/823814
9,947,649 B1 * 4/2018 Balakrishnan .... H01L 29/66136
(Continued)

FOREIGN PATENT DOCUMENTS

| CN | 104465750 A | 3/2015 |
|---|---|---|
| EP | 3288067 A1 | 2/2018 |
| KR | 101547394 B1 | 8/2015 |

OTHER PUBLICATIONS

Extended European Search Report and Written Opinion, Application No. EP20175230.0, dated Oct. 15, 2020, 10 pages.
(Continued)

*Primary Examiner* — Alexander G Ghyka
(74) *Attorney, Agent, or Firm* — McDonnell Boehnen Hulbert & Berghoff LLP

(57) ABSTRACT

A method for forming a III-V construction over a group IV substrate comprises providing an assembly comprising the group IV substrate and a dielectric thereon. The dielectric layer comprises a trench exposing the group IV substrate. The method further comprises initiating growth of a first III-V structure in the trench, continuing growth out of the trench on top of the bottom part, growing epitaxially a sacrificial second III-V structure on the top part of the first III-V structure, and growing epitaxially a third III-V structure on the sacrificial second III-V structure. The third III-V structure comprises a top III-V layer. The method further comprises physically disconnecting a first part of the top layer from a second part thereof, and contacting the sacrificial second III-V structure with the liquid etching medium.

18 Claims, 10 Drawing Sheets

(51) Int. Cl.
  *H01L 29/66* (2006.01)
  *H01L 29/778* (2006.01)
(52) U.S. Cl.
  CPC .. *H01L 21/02392* (2013.01); *H01L 21/02398* (2013.01); *H01L 29/267* (2013.01); *H01L 29/66462* (2013.01); *H01L 29/7787* (2013.01)

(56) References Cited

U.S. PATENT DOCUMENTS

| | | | |
|---|---|---|---|
| 10,431,690 | B2 | 10/2019 | Rachmady et al. |
| 2009/0045437 | A1 | 2/2009 | Sandhu et al. |
| 2016/0064289 | A1* | 3/2016 | Xiao ............... H01L 21/02576 257/369 |
| 2017/0141199 | A1* | 5/2017 | Demuynck ......... H01L 29/0847 |
| 2018/0175201 | A1* | 6/2018 | Wang ............... H01L 29/4966 |
| 2018/0269329 | A1* | 9/2018 | Balakrishnan ...... H01L 29/7889 |
| 2019/0348532 | A1 | 11/2019 | Romanczyk et al. |

OTHER PUBLICATIONS

Vais, A., L. Witters, Y. Mols, A. S. Hernandez, A. Walke, H. Yu, M. Baryshnikova et al. "First demonstration of III-V HBTs on 300 mm Si substrates using nano-ridge engineering." In 2019 IEEE International Electron Devices Meeting (IEDM), pp. 9-1. IEEE, 2019.

Megalini, Ludovico, Simone Tommaso Šuran Brunelli, William O. Charles, Aidan Taylor, Brandon Isaac, John E. Bowers, and Jonathan Klamkin. "Strain-compensated InGaAsP superlattices for defect reduction of InP grown on exact-oriented (001) patterned Si substrates by metal organic chemical vapor deposition." Materials 11, No. 3 (2018): 337.

Holland, Martin, Mark van Dal, Blandine Duriez, Richard Oxland, Georgios Vellianitis, Gerben Doornbos, Aryan Afzalian et al. "Atomically flat and uniform relaxed III-V epitaxial films on silicon substrate for heterogeneous and hybrid integration." Scientific reports 7, No. 1 (2017): 1-6.

Lee, Subin, Seong Kwang Kim, Jae-Hoon Han, Jin Dong Song, Dong-Hwan Jun, and Sang-Hyeon Kim. "Epitaxial lift-off technology for large size III-V-on-insulator substrate." IEEE Electron Device Letters 40, No. 11 (2019): 1732-1735.

Ko, Kwang-Man, Jung-Han Seo, Dong-Eun Kim, Sang-Tae Lee, Young-Kyun Noh, Moon-Deock Kim, and Jae-Eung Oh. "The growth of a low defect InAs HEMT structure on Si by using an AlGaSb buffer layer containing InSb quantum dots for dislocation termination." Nanotechnology 20, No. 22 (2009): 225201.

Kunert, B., W. Guo, Y. Mols, Bin Tian, Zhechao Wang, Yuting Shi, Dries Van Thourhout et al. "III/V nano ridge structures for optical applications on patterned 300 mm silicon substrate." Applied Physics Letters 109, No. 9 (2016): 091101.

\* cited by examiner

INTEGRATION OF A III-V CONSTRUCTION ON A GROUP IV SUBSTRATE

CROSS-REFERENCE TO RELATED APPLICATIONS

The present application is a non-provisional patent application claiming priority to European Patent Application No. 20175230.0, filed May 18, 2020, the contents of which are hereby incorporated by reference.

FIELD OF THE DISCLOSURE

The disclosure relates to the field of III-V semiconductors. More specifically, the disclosure relates to a method for monolithically integrating III-V constructions on a group IV substrate.

BACKGROUND

III-V materials such as GaAs, InGaAs, or InP, typically exhibit higher electron mobility and saturation velocity than Si. Such materials can also deliver more power at a high frequency compared to Si. Such materials are, therefore, widely used in radio frequency applications. When very high frequencies (GHz or higher) are targeted, Si devices cannot in some instances be used effectively.

Some devices making use of III-V materials are built on small size-III-V wafers. Such wafers are, however, very expensive compared to Si wafers. There is, therefore, an interest in finding ways to monolithically integrating III-V devices on a silicon substrate. This is, however, difficult because of the lattice mismatch between the III-V material and the silicon substrate as this results in defects in the grown III-V material.

Using selective area growth, III-V materials can be deposited on silicon substrates by multiple approaches. These approaches work by confining the defects generated by the large lattice mismatch between the III-V material and Si in a lower part of the III-V material to ensure a threading dislocation-free material at the top of the structure where the III-V device is built. One of these approaches makes use of nano-ridges.

Nano-ridges are semiconductor structures having a bottom part having a first width and a top part having a second width that is larger than the first width. The bottom part is grown in dielectric trenches and the top part is formed when the growth is continued out of the dielectric trenches. The base of the top part has a width that gradually expands with distance from the interface between the bottom part and the top part, thereby forming a funnel-shaped base. On top of this base is an upper portion of the top part, which can have a constant width equal to the width of the upper surface of the base of the top part, and having a flat top surface. Such structures have been described by Kunert et al. (Applied Physics Letters, 109, 091101 (2016). Since the bottom part is grown in a narrow trench, the bottom part benefits from aspect ratio trapping and its top surface is defect-poor or defect-free. As a result, the top part is also defect-poor or defect-free.

Aside from defectivity, the background doping level of the layers making up a III-V structure is also important. For instance, the background doping level in layers underlying a transistor channel can lead to unwanted leakage paths. There is, therefore, still a need in the art for improved methods and devices to lower this background doping level.

SUMMARY

Apparatus and methods for integrating III-V structures on a Si substrate are disclosed herein.

In a first aspect, a method for forming a group III-V semiconductor construction over a group IV substrate comprises:
  Providing an assembly in an epitaxial growth chamber, the assembly comprising a monocrystalline group IV substrate and a first dielectric layer thereon, the first dielectric layer comprising a trench having a bottom exposing the group IV substrate,
  Initiating growth of a first III-V structure in the trench, thereby forming a bottom part of the first III-V structure inside the trench,
  Continuing growth out of the trench on top of the bottom part, thereby forming a top part of the first III-V structure,
  Growing epitaxially a sacrificial second III-V structure on the top part of the first III-V structure, the sacrificial second III-V structure being etchable selectively with respect to the first III-V structure in a liquid etching medium,
  Growing epitaxially a third III-V structure on the sacrificial second III-V structure, the third III-V structure comprising:
    i. A bottom III-V layer on the sacrificial second III-V structure (6), wherein the sacrificial second III-V structure is etchable selectively with respect to the bottom layer in the liquid etching medium, and
    ii. A top III-V layer,
  Physically disconnecting a first part of the third III-V structure from a second part thereof, and
  Contacting the sacrificial second III-V structure with the liquid etching medium, thereby selectively etching the sacrificial second III-V structure with respect to the first III-V structure and the bottom layer, thereby forming a cavity.

In a second aspect, a III-V semiconductor construction comprises:
  a. an assembly comprising a monocrystalline group IV substrate and a first dielectric layer thereon, the first dielectric layer comprising a trench having a bottom exposing the group IV substrate,
  b. a first III-V structure comprising a bottom part inside the trench and a top part out of the trench on top of the bottom part,
  c. a cavity or a dielectric structure on the top part of the first III-V structure, and
  d. a third III-V structure on the cavity or dielectric structure, the third III-V structure comprising a bottom III-V layer on the cavity or dielectric structure, and a top III-V layer comprising a first part physically disconnected from a second part.

An example of the first aspect facilitates integration of III-V devices on group IV substrates.

An example of the first aspect facilitates the formation of devices for RF applications on group IV substrates.

An example of the first aspect facilitates the formation of devices for RF applications on group IV substrates.

An example of the first aspect facilitates the formation of devices exhibiting high electron mobility and saturation velocity on group IV substrates.

An example of the first aspect facilitates the formation of devices that can deliver high power at high frequency on group IV substrates.

An example of the first aspect facilitates the formation of III-V devices at a low cost.

An example of the first aspect facilitates the formation of III-V devices having low defectivity on group IV substrates.

An example of the first aspect facilitates the formation of III-V transistor devices having on group IV substrates wherein the background doping level in layers underlying the transistor channel is very low.

An example of the first aspect facilitates the formation of III-V constructions and devices with low parasitic capacitive coupling with the substrate.

Particular and preferred aspects are set out in the accompanying independent and dependent claims. Features from the dependent claims may be combined with features of the independent claims and with features of other dependent claims as appropriate and not merely as explicitly set out in the claims. Further aspects can be elucidated from the detailed description, taken in conjunction with the accompanying drawings. This description is given for the sake of example only and should not be construed as limiting the scope of the claims. The reference figures quoted below refer to the attached drawings.

BRIEF DESCRIPTION OF THE FIGURES

The above, as well as additional features, will be better understood through the following illustrative and non-limiting detailed description of example embodiments, with reference to the appended drawings.

FIG. 1 shows a monocrystalline group IV substrate, in accordance with example embodiments.

FIG. 2 shows a construction obtained after performing first steps, in accordance with example embodiments.

FIG. 3 shows a construction obtained after performing second steps, in accordance with example embodiments FIG. 4 shows an intermediate structure, in accordance with example embodiments.

FIG. 7 shows a structure after the contacting of a sacrificial second III-V structure with a liquid etching medium, in accordance with example embodiments.

FIG. 8 shows a structure after the filling of a cavity with a dielectric material, in accordance with example embodiments FIGS. 9 and 10 schematically show layout strategies for high-electron-mobility transistors (HEMTs), in accordance with example embodiments In the figures, the same reference signs refer to the same or analogous elements. All the figures are schematic, not necessarily to scale, and generally only show parts that are necessary to elucidate example embodiments, wherein other parts may be omitted or merely suggested.

DETAILED DESCRIPTION

Figure 1:
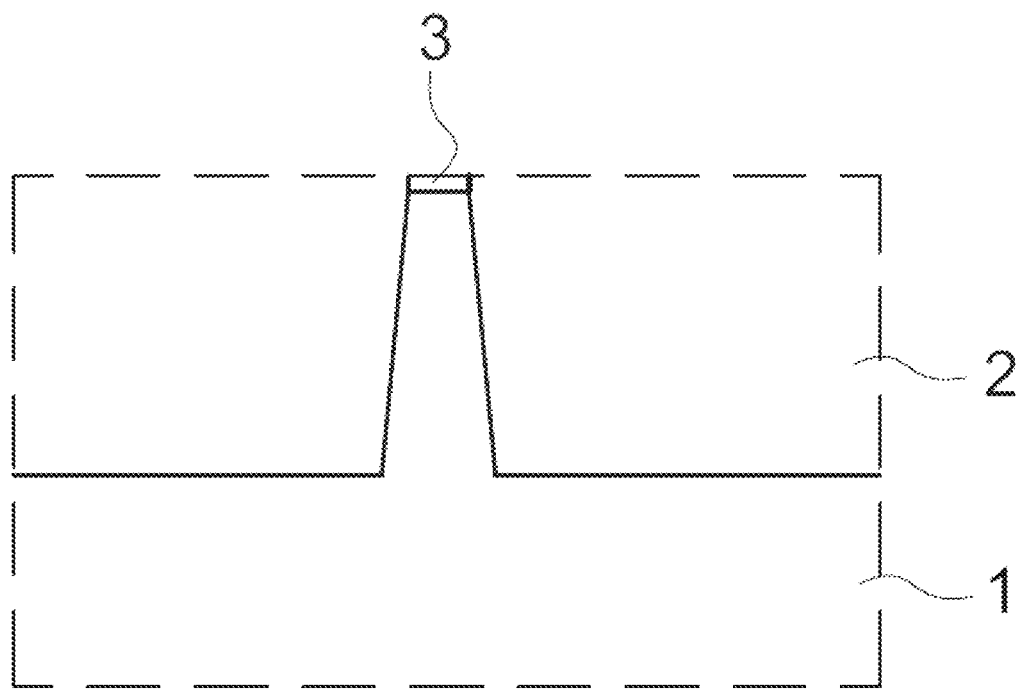
FIGS. 1-4 and 7-8 are vertical cross-sections through schematic representations of intermediates in a method, in accordance with example embodiments.

Example embodiments will now be described more fully hereinafter with reference to the accompanying drawings. That which is encompassed by the claims may, however, be embodied in many different forms and should not be construed as limited to the embodiments set forth herein. Rather, these embodiments are provided by way of example. Furthermore, like numbers refer to the same or similar elements or components throughout. The drawings described are only schematic and are non-limiting. In the drawings, the size of some of the elements may be exaggerated and not drawn on scale for illustrative purposes. The dimensions and the relative dimensions do not correspond to actual reductions to practice.

Furthermore, the terms first, second, third, and the like in the description and in the claims, are used for distinguishing between similar elements and not necessarily for describing a sequence, either temporally, spatially, in ranking, or in any other manner. It is to be understood that the terms so used are interchangeable under appropriate circumstances and that the embodiments described herein are capable of operation in other sequences than described or illustrated herein.

Moreover, the terms top, bottom, over, under, and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising," used in the claims, should not be interpreted as being restricted to the means listed thereafter; the term does not exclude other elements or steps. The term is thus to be interpreted as specifying the presence of the stated features, integers, steps, or components as referred to, but does not preclude the presence or addition of one or more other features, integers, steps, or components, or groups thereof. The term "comprising" therefore covers the situation where only the stated features are present and the situation where these features and one or more other features are present. The word "comprising," therefore, also includes as one embodiment that no further components are present. Thus, the scope of the expression "a device comprising means A and B" should not be interpreted as being limited to devices consisting only of components A and B.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner, as would be apparent to one of ordinary skill in the art from this disclosure, in one or more embodiments.

Similarly, it should be appreciated that in the description of example embodiments, various features are sometimes grouped together in a single embodiment, figure, or description thereof for the purpose of streamlining the disclosure and aiding in the understanding of one or more aspects. This method of disclosure, however, is not to be interpreted as reflecting an intention that more features than are expressly recited in each claim are required. Rather, as the following claims reflect, aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the claims, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means for carrying out certain functions. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of performing certain aspects.

In the description provided herein, numerous specific details are set forth. However, it is understood that embodiments may be practiced without these specific details. In other instances, well-known methods, structures, and techniques have not been shown in detail in order not to obscure an understanding of this description.

The following terms are provided solely to aid in the understanding of certain aspects of the disclosure.

As used herein and unless provided otherwise, the term "III-V," when applied to a material, relates to a material comprising of at least one group III (IUPAC group 13) element and at least one group V element (IUPAC group 15). This includes binary compounds as well as higher-order compounds such as ternary compounds.

As used herein, transistors correspond to three-terminal devices having a first main electrode such as a drain, a second main electrode such as a source, and a control electrode such as a gate for controlling the flow of electrical charges between the first and second main electrodes.

A first aspect relates to a method for forming a group III-V semiconductor construction. This construction typically comprises a plurality of different III-V semiconductor layers. Examples of the semiconductor construction correspond to either a III-V semiconductor device or an intermediate in the construction of a semiconductor device. Examples of the group IV substrate correspond to a Si or Ge substrate (e.g., a wafer).

FIG. 1 shows a monocrystalline group IV substrate (1) (e.g., Si) in which fins have been patterned with the help of a hard mask (3) and which has been covered with a dielectric layer (e.g., $SiO_2$), which top surface is coplanar with the top surface of the hard mask (3). The structure of FIG. 1 can then be subjected to a removal of the hard mask (3) and to an etching of the monocrystalline group IV substrate (1) selectively with respect to the dielectric layer (3) so as to form the trench of the assembly provided in the method step calling for providing the assembly. This etching can, for instance, be performed with tetramethylammonium hydroxide (TMAH) if the substrate (1) is an Si substrate (1). This facilitates forming a V-shaped trench bottom.

Figure 2:
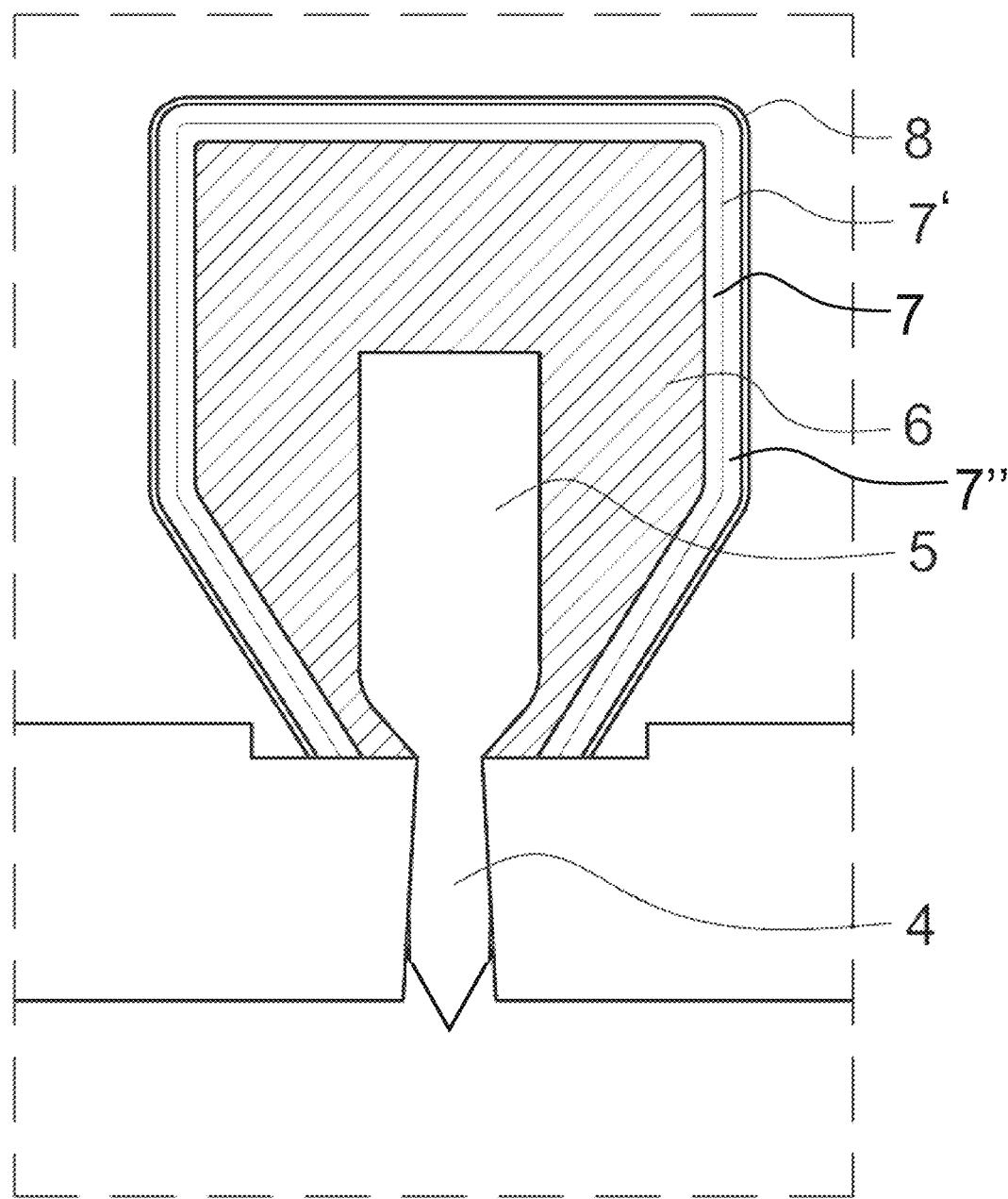

FIG. 2 shows an example of a construction obtained in embodiments after growing epitaxially a third III-V structure.

The method step of the method of the first aspect calling for providing an assembly comprises providing an assembly in an epitaxial growth chamber, the assembly comprising the monocrystalline group IV substrate (1) and a first dielectric layer (2) thereon, the first dielectric layer (2) comprising a trench having a bottom exposing the group IV substrate (1).

For forming the construction, the assembly is provided in an epitaxial growth chamber where the growing conditions can be controlled. For instance, a metal-organic vapor phase epitaxy (MOVPE) chamber can be used.

An example of the first dielectric layer (2) on the monocrystalline group IV substrate (1) is an oxide layer. In another example, the first dielectric layer 2 is a layer of an oxide of the group IV material making up the substrate (1). For instance, in an example, if the substrate (1) is a Si substrate (1), the first dielectric layer (2) is a silicon oxide layer and the assembly comprises a Si substrate (1) and a silicon oxide layer thereon.

In an example, the first dielectric layer (2) has a thickness between 200 nm and 500 nm. In another example, the thickness is between 250 nm and 450 nm.

The first dielectric layer (2) comprises a trench.

The assembly may be formed through a shallow trench isolation process whereby one or more trenches are obtained in the dielectric layer. Defects are trapped in the trench. Therefore, in an example, the width of the trench is smaller than the depth of the trench. The width of the trench may, for example, be from ⅙ to ½ of the thickness of the dielectric layer where the trench is present. The width of the trench may, for example, be from 50 nm to 150 nm if the dielectric layer has a thickness of 300 nm.

In an example, the aspect ratio (trench depth over trench width) is larger than 1.43. This facilitates trapping all misfit-induced defects. The trenches are made through the dielectric layer meaning that direct physical contact with the group IV substrate (1) can be made through the trenches. In some example embodiments, the dielectric trenches may have a V-shaped group IV bottom. This facilitates avoiding anti-phase disorder in the III/V layer. In other example embodiments, the bottom is flat.

Aspects of the embodiments facilitate trapping strain-induced defects, initiated by the lattice mismatch between the III-V material and the group IV substrate (1), at the sidewalls of the trenches close to the III-V to group IV interface. Therefore, the overgrown top portion of the first III-V structure has a significantly reduced defect density, which facilitates device integration.

Step b of the method comprises initiating growth of a first III-V structure in the trench, thereby forming a bottom part (4) of the first III-V structure inside the trench.

In embodiments, to initiate the growth of the first III-V structure in the trench, precursors of the group III and group V elements making up the III-V material of the first III-V structure may be introduced in the chamber.

The composition of each III-V structure of the first aspect, and in particular of the first, second, and third III-V structure (7, 7', 7", 8), as well as each layer making up the third III-V structure (7, 7', 7", 8), is such that it comprises 50% group V and 50% group III atoms.

In embodiments, the first III-V structure may comprise $In_xGa_{1-x}As_zE_{1-z}$ wherein $0 \le x \le 1$, $0 \le z \le 1$, and E is selected from P, Sb, and N.

In embodiments, $0.5 \le z \le 1$. In embodiments, z may be equal to one.

In embodiments, the first III-V structure may comprise $In_xGa_{1-x}As$ wherein x goes from 0 to 1. The whole range from GaAs to InAs is suitable.

In embodiments, $0.51 \le x \le 0.55$, and $z=1$. This is particularly suitable when the top III-V layer of the third III-V structure (7, 7', 7", 8) is InP because it facilitates a good match between the lattice constants of the first structure and the lattice constant of InP. In such a case, in an example, $0.52 \le x \le 0.54$, and $z=1$, and in another example, $x=0.53$, and $z=1$.

In an example, the material of the first III-V structure is selected in such a way that the mismatch between the lattice constant of that material when unstrained (i.e., relaxed) and the lattice of the material of the top III-V layer of the third III-V structure (7, 7', 7", 8) when unstrained (i.e., relaxed) is, in an example, at most 1%, and in another example, at most 0.5%.

In an example, the material of the first III-V structure is selected in such a way that the mismatch between the lattice constant of that material when unstrained (i.e., relaxed) and the lattice of the material of the top III-V layer of the third III-V structure (7, 7', 7", 8) and of all layers in between is, in an example, at most 1%, and in another example, at most 0.5%.

Example of precursors for the formation of each III-V structure of the first aspect, and in particular of the first, second, and third III-V structure (7, 7', 7", 8), as well as each layer making up the third III-V structure (7, 7', 7", 8) are trialkylgallium such as triethylgallium (TEGa) and trimethylgallium (TMGa); trialkylindium such as trimethylindium (TMIn), alkylarsine such as tertiarybutylarsine (TBAs), arsine gas ($AsH_3$), trialkylantimony such triethylantimony (TESb) or trimethylantimony (TMSb), trialkylaluminium such as trimethylaluminium (TMAl), tertiaryalkylphosphine such as tertiarybutylphosphine (TBP), phosphine ($PH_3$), and dialkylhydrazine such as 1,1-dimethylhydrazine.

For instance, in an example where the first III-V structure comprises $In_xGa_{1-x}As$ wherein x goes from 0 to 1, the following precursor combinations may be used:

TMGa, TMIn, TBAs
TMGa, TMIn, $AsH_3$,
TEGa, TMIn, TBAs, and
TEGa, TMIn, $AsH_3$.

The applied mol-flux may, for example, be between the following ranges of values:

For TMGa the mol-flux may, for example, be between 1.0E−5 and 2.0E−4 [mol/min] or between 1.5E−5 and 1E−4 [mol/min] or for TEGa the mol-flux may, for example, be between 0.2E−5 and 2.0E−4 [mol/min], or between 1.0E−5 and 1E−4 [mol/min].

For TMIn the mol-flux may, for example, be between 1.9E−5 and 1.9E−4 [mol/min], or between 3.8E−5 and 1.5E−4 [mol/min].

The flux of the TBAs may be adjusted according to the Ga+In mol/min flux to meet a specific TBAs/(TMGa+TMIn) or TBAs/(TEGa+TMIn) ratio. This ratio is, for example, between 5 and 200, or between 10 and 80.

The flux of AsH3 may be adjusted according to the Ga+In mol/min flux to meet a specific AsH3/(TMGa+TMIn) or AsH3/(TEGa+TMIn) ratio. This ratio is, for example, between 50 and 1000, or between 50 and 500.

In embodiments, the method step calling for initiating growth of a first III-V structure may be performed in two stages. In a first stage, nucleation of a seed layer of the material of the first III-V structure may be achieved on the group IV surface, while in a second stage, the rest of the trench may be filled, thereby completing the bottom part (4) of the first III-V structure. In these embodiments, the seed layer and the filling of the rest of the trench may be done under different growth conditions. The thickness of the seed layer may, for example, be from 5 to 30 nm.

In embodiments, the seed layer (III-V nucleation on the group IV surface) may, for example, be done at a temperature from 300° C. to 450° C.

In embodiments, filling the rest of the trench may, for example, be done at from 350° C. to 700° C., preferably 350° C. to 500° C.

In general, the method step calling for initiating growth of a first III-V structure may be performed at a temperature of from 300° C. to 500° C. The method step calling for continuing growth is typically performed at a temperature at least equal to the one used in the method step calling for initiating growth of a first III-V structure for initiating the growth.

The seed layer facilitates providing good wetting of the group IV (e.g., Si) substrate (1) for the next layer and, together with the filling layer, compensates the lattice mismatch between the group IV substrate (1) (Si) and the first III-V structure (e.g., $In_xGa_{1-x}As$), but it does not affect the shape of the top portion of the first III-V structure.

In the method step calling for continuing growth out of the trench on top of the bottom part, the growth started in the trench is continued out of the trench on top of the bottom part (4), thereby forming a top part (5) of the first III-V structure.

In embodiments, the temperature in the chamber may be set to be at least 50° C. higher during the method step calling for continuing growth out of the trench on top of the bottom part out of the trench on top of the bottom part than during the method step calling for initiating growth of a first III-V structure.

In embodiments, the temperature in the chamber may be set to 400° C. or higher when the top part (5) of the first III-V structure is growing out of the trench.

In embodiments, at least one surfactant may be added in the chamber when the top part (5) of the first III-V structure is growing out of the trench. In some examples, no surfactant is added if threading dislocations are still present on the top surface of the growing III-V structure. Typically, the surfactant is only added once the top surface of the growing III-V structure is threading-dislocation free. This is typically the case during the method step calling for continuing growth out of the trench on top of the bottom part. Therefore, in an example, the surfactant is added when the first III-V structure is growing out of the trench. In some embodiments, the surfactant may also be added in the method step calling for initiating growth of a first III-V structure when the growth front of the first III-V structure is still inside the trench. In an example, the best moment to add the surfactant is when the first III-V structure is fully relaxed and all threading dislocations are trapped at the sidewalls of the trench. This can, in some embodiments, already occur during the method step calling for initiating growth of a first III-V structure inside the trench. Depending on the trench depth, the moment when the first III-V structure is fully relaxed may be when the filling layer is still inside the trench. For deeper trenches, the point where the III-V layer is fully relaxed and without threading dislocations will be deeper inside the trench.

The surfactant changes the surface energy and thus alters the migration length of the atoms participating in the growing process of the first III-V structure. The surfactant changes the properties on the crystal surface and hence the growth characteristics. Use of the surfactant facilitates obtaining a first III-V structure with a flat (001) surface at a higher temperature than would be the case if no surfactant would be used. Thus, a funnel-shaped or a box-shaped first III-V structure can be formed at high growth temperatures. The temperature may, for example, be higher than 400° C., for example, higher than 500° C. The temperature may, for example, be above 525° C. It may, for example, be a temperature between 500° C. and 700° C. or between 525° C. and 625° C. By increasing the temperature, the relaxation in the trench is improved along with the mobility of atoms and molecules on the surface. Without being bound by theory, it is assumed that the addition of a surfactant in the method step calling for continuing growth out of the trench on top of the bottom part decreases the mobility of the group-III and group-V atoms already incorporated in the first group III-V structure.

In embodiments, the at least one surfactant may be selected from a list of surfactants consisting of gallium-precursors (e.g., trialkylgallium such as triethylgallium (TEGa) and trimethylgallium (TMGa)), indium precursors (e.g., trialkylindium such as trimethylindium (TMIn)), arsenic precursors (e.g., alkylarsine such as tertiarybutylarsine (TBAs), or arsine gas ($AsH_3$)), antimony precursors (e.g., trialkylantimony such triethylantimony (TESb) or trimethylantimony (TMSb)), bismuth precursors (e.g., triphenylbismuth or trimethylbismuth), tellurium precursors (e.g., diethyltellurium), zinc precursors (e.g., dimethylzinc or diethylzinc), magnesium precursors (e.g., magnesocene), manganese precursors (e.g., bis-cyclopentadienyl manganese), tin precursors (such as tin chloride), hydrogen chloride, carbon tetrabromide, chlorine gas, bromochloromethanes (e.g., $CCl_3Br$, $CCl_2Br_2$, and $CClBr_3$), and carbon tetrachloride. In an example, the surfactant may not comprise a group III or group V element already used for growing the first III-V structure in the method step calling for initiating growth of a first III-V structure. The surfactant preferably comprises a group III or group V element different from any group III or group V element already used for growing the first III-V structure in the method step calling for initiating growth of a first III-V structure.

In embodiments, when the first III-V structure comprises $In_xGa_{1-x}As$, wherein x goes from 0 to 1, the surfactant may be a Sb precursor such as a trialkylantimony (e.g., TESb or TMSb). In such a case, e.g., for TESb or TMSb, the mol-flux may, for example, be between 1.0E−5 and 6.5E−4, better 3.3E−5 3.2E−4 [mol/min].

In embodiments, the amount of surfactant may be adapted so that a concentration inferior to 1E19 $cm^{-3}$ or inferior to 1E20 $cm^{-3}$ is incorporated in the top part of the first III-V structure. In an example, no surfactant is incorporated in the first III-V structure. This allows the surfactant to change the growth characteristics without substantially changing the chemical nature of the III-V structure.

In embodiments, the exposure time of the first III-V structure to the surfactant may be adapted so that no surfactant is incorporated in the first III-V structure. This allows the surfactant to change the growth characteristics without changing the chemical nature of the III-V structure.

In an example, the first III-V structure obtained at the end of the method step calling for continuing growth out of the trench has a flat (001) surface. Although the growth of the first III-V structure with a flat (001) surface is possible at low growth temperature, this leads easily to non-uniform structures with a rough top (001) surface, because of the low-temperature growth. This may not be suitable in some instances for device integration. Adding of the surfactant facilitates increasing the growth temperature while still forming a flat (001) surface.

In embodiments, a plurality of first III-V structures are grown during the method steps calling for initiating growth and continuing growth, and the method steps calling for growing epitaxially a sacrificial second III-V structure to contacting the sacrificial second III-V structure are performed on each of the plurality of first III-V structures.

In embodiments, the first III-V structures forming the plurality all have the same shape and dimensions. In other words, they may be uniform. Typically, the top surfaces of the III-V structures within the plurality are coplanar. Embodiments facilitate the hetero-epitaxial integration of coplanar and uniform III-V structures on Si substrates (1) with a flat (001) surface for device integration.

In example embodiments, the group III-V semiconductor construction is grown using metal-organic vapor phase epitaxy (MOVPE). It is, however, also possible to perform aspects herein using hydride vapor phase epitaxy or molecular beam epitaxy.

In hydride vapor phase epitaxy, HCl reacts with group-III metals to produce gaseous chlorides that go to the deposition chamber. For group-V, it uses hydrides with $H_2$ as carrier gas.

MBE uses mostly solid metallic sources (such as Ga and As), but other types of sources are possible as well. It is an ultra-high-vacuum evaporation technique, hence, no carrier gas is necessary.

In embodiments, the carrier gas used in the chamber (e.g., MOVPE chamber) to introduce the precursors may, for example, be $N_2$ or $H_2$.

In embodiments, the pressure in the chamber (e.g., MOVPE chamber) may, for example, be between 5 torr and 450 torr, or between 10 torr and 150 torr.

In embodiments, the total carrier flow during any of the method steps calling for initiating growth of a first III-V structure to growing epitaxially a third III-V structure may be between 10 l/min and 30 l/min, or between 15 l/min and 25 l/min.

In embodiments, the first III-V structure may be a nanoridge.

Although embodiments of the method have been described in connection with the formation of HEMTs, embodiments of the method can be used to form other types of devices such as silicon photonics devices, analog RF devices, imagers, etc.

In the method step calling for growing epitaxially a sacrificial second III-V structure, a sacrificial second III-V structure (6) is grown on the top part (5) of the first III-V structure. The sacrificial second III-V structure (6) is etchable selectively with respect to the first III-V structure in a liquid etching medium.

In an example, the sacrificial second III-V structure (6) is made of a material having a relaxed (i.e., unstrained) lattice parameter, which is within 1%, or within 0.5% of the relaxed (i.e., unstrained) lattice parameter of the first III-V structure.

In an example, the sacrificial second III-V structure (6) is lattice-matched with the first III-V structure. In embodiments where the first III-V structure is made of $In_xGa_{1-x}As$ wherein $0.51 \leq x \leq 0.55$, or $0.52 \leq x \leq 0.54$, and or x=0.53, the second sacrificial III-V structure may be InP. This facilitates selectively etching InP with respect to $In_xGa_{1-x}As$ wherein $0.51 \leq x \leq 0.55$ and because InP is lattice-matched with $In_xGa_{1-x}As$ wherein x=0.53.

Examples of precursors for the formation of InP are TMIn and either TBP or $PH_3$.

The flux of TMIn may, for example, be between 1.9E−5 and 1.9E−4 [mol/min], or between 2.9E−5 and 1.6E−4 [mol/min]. The flux of TBP may be adjusted to meet a specific TBP/TMIn ratio. An example of this ratio is between 5 and 400, or between 10 and 200.

The flux of $PH_3$ may be adjusted to meet a specific $PH_3$/TMIn ratio. An example of this ratio is between 50 and 1000, or between 50 and 600.

InP can be grown for instance at a temperature of from 400° C. to 700° C., or from 475° C. to 625° C.

The liquid etching medium is selected so that it can etch the second III-V structure (6) without either etching the first III-V structure or the bottom III-V layer (7) of the third III-V structure (7, 7', 7", 8).

For instance, in order to selectively etch InP with respect to InGaAs, concentrated HCl can be used.

In the method step for growing epitaxially the third III-V structure, a third III-V structure (7, 7', 7", 8) is epitaxially grown on the sacrificial second III-V structure (6), the third III-V structure (7, 7', 7", 8) comprising:
   i. A bottom III-V layer (7) on the sacrificial second III-V structure (6), wherein the sacrificial second III-V structure (6) is etchable selectively with respect to the bottom layer in the liquid etching medium, and
   ii. A top III-V layer.

In an example, the bottom III-V layer (7) is made of a material having a relaxed (i.e., unstrained) lattice parameter that is within 1%, or 0.5% of the relaxed (i.e., unstrained) lattice parameter of the sacrificial second III-V structure (6).

In embodiments, the bottom III-V layer (7) may comprise $In_yAl_{1-y}As$ wherein y is from 0.51 to 0.53, or is 0.52. In other embodiments, the bottom III-V layer (7) may comprise $In_wGa_{1-w}As$ wherein w is from 0.52 to 0.54, or w is 0.53. These embodiments where the bottom III-V layer (7) is either $In_yAl_{1-y}As$ or $In_wGa_{1-w}As$ are useful when the sacrificial layer is InP because these materials have a lattice constant close to or even matching the lattice constant of InP. Furthermore, InP can be removed selectively with a liquid etching medium with respect to these layers.

In embodiments, the materials making up the first III-V structure, the sacrificial second III-V structure (6), and the layers constituting the third III-V structure (7, 7', 7", 8) have a lattice constant within 1%, or within 0.5% of each other. In an example, the materials making up the first III-V structure, the sacrificial second III-V structure (6), and the layers constituting the third III-V structure (7, 7', 7", 8), are all lattice-matched with respect to each other.

In embodiments, the top III-V layer may comprise InP. This facilitates use in very high-frequency devices operating at 1 GHz or above because InP has an electron mobility and a saturation velocity compatible with such devices.

In embodiments, the third III-V structure (7, 7', 7", 8) may comprise a bottom first $In_yAl_{1-y}As$ layer, an $In_wGa_{1-w}As$ layer on the bottom first $In_yAl_{1-y}As$ layer, a second $In_yAl_{1-y}As$ layer over and on the $In_wGa_{1-w}As$ layer, thereby sandwiching the $In_wGa_{1-w}As$ layer between two $In_yAl_{1-y}As$ layers, and a top InP layer on the second $In_yAl_{1-y}As$ layer, wherein y is from 0.51 to 0.53, and or y is 0.52, and wherein w is from 0.52 to 0.54, and or w is 0.53. These embodiments are particularly suitable for forming HEMTs. $In_yAl_{1-y}As$ has a higher bandgap than $In_wGa_{1-w}As$. Sandwiching $In_wGa_{1-w}As$ between $In_yAl_{1-y}As$ layers forms a quantum well with the $In_wGa_{1-w}As$ layer. As a result, the $In_wGa_{1-w}As$ layer acts as a high mobility channel layer that can carry most of the current.

In embodiments, a delta doping may be performed in the top and/or bottom $In_yAl_{1-y}As$ layer. Upon the formation of the quantum well, the carriers provided by dopants fall into the channel $In_wGa_{1-w}As$ layer forming a 2D electron gas that can be used for conduction of current. Since the channel remains undoped, it can offer very high mobility for the carriers.

Figure 3:
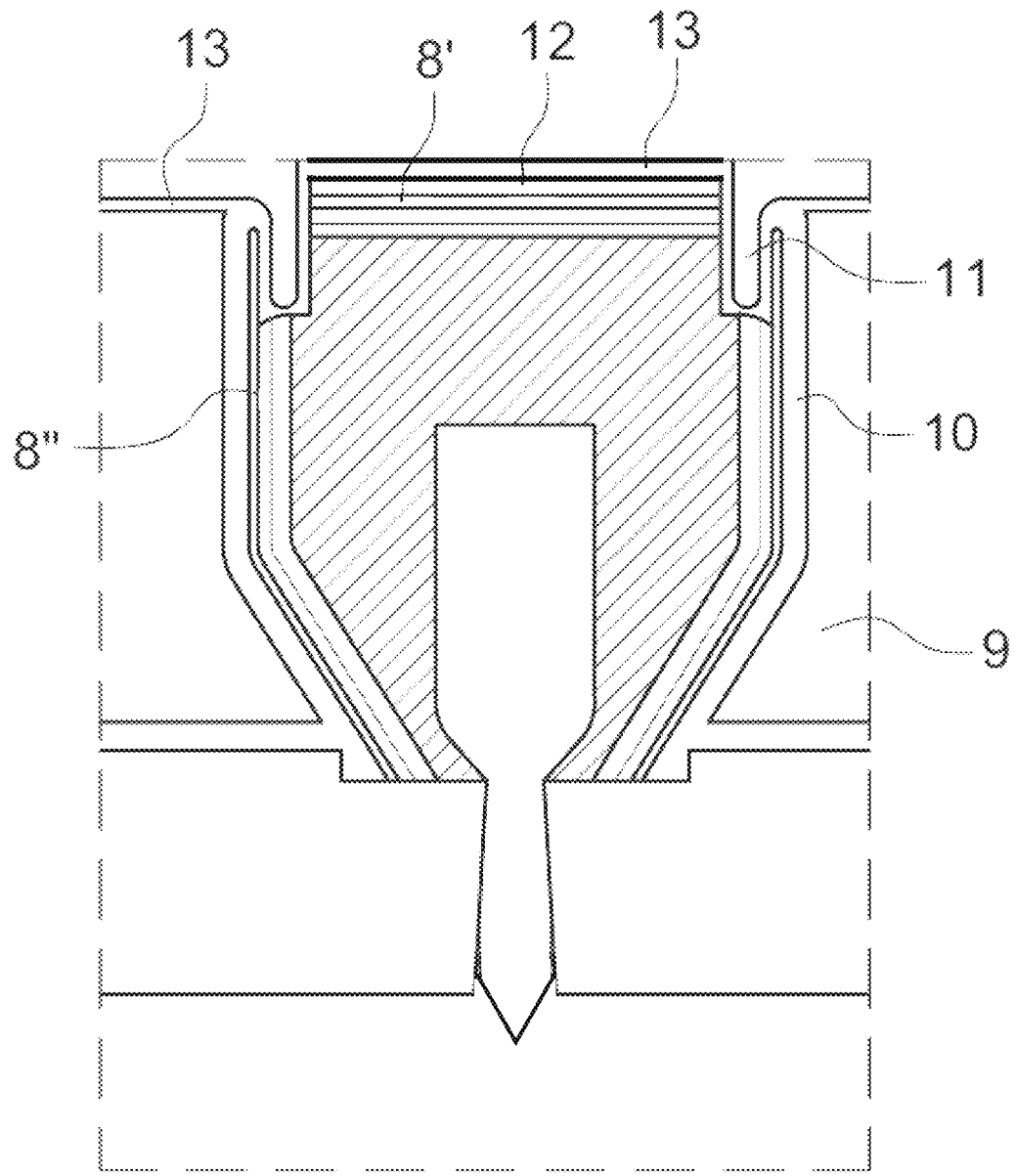

FIG. 3 shows an example of a construction according to an embodiment after the method step calling for planarizing the top surface of the structure.

In the method step calling for physically disconnecting a first part, a first part (8') of the top layer (8) of the third III-V structure (7, 7', 7", 8) is physically disconnected from a second part (8") thereof. In other words, the top layer (8) of the third III-V structure (7, 7', 7", 8) may be made discontinuous by creating a gap between a first part (8') of the top layer (8) and a second part (8") thereof. To achieve this, typically, a first part of the entire third III-V structure (7, 7', 7", 8) may be physically disconnected from a second part thereof.

In embodiments, the method step calling for physically disconnecting a first part may comprise the steps of:
   Forming a passivation layer (10) on the top III-V layer (8) and on exposed surfaces of the assembly,
   Embedding the passivated third III-V structure (7, 7', 7", 8) with a second dielectric layer (9) so that the second dielectric layer (9) is coplanar with a top surface of the passivation layer (10),
   Exposing a top portion of the top III-V layer (8) by etching away a top portion of the passivation layer (10) by using the dielectric layer as a mask,
   Covering the exposed top portion of the top III-V layer (8) and an exposed portion of the second dielectric layer (9) with a third dielectric layer (12),
   Forming a masking element (e.g., a photoresist) over the first part (8') of the top III-V layer (8),
   Etching the third dielectric layer (12) by using the masking element as a mask until part of the top III-V layer (8) and of the passivation layer (10) is exposed, and
   Etching the third III-V structure (7, 7', 7", 8) by using the masking element, the passivation layer (10), and the third dielectric layer (12) as a mask, thereby physically disconnecting a first part (8') of the top layer (8) from a second part (8") thereof. At the end of the method step calling for etching the third III-V structure. A trench (11) is present, disconnecting the first part (8') from the second part (8").

At this stage, a first part (8') of the third III-V structure (7, 7', 7", 8) is typically physically disconnected from a second part (8") thereof.

A further group of processing steps comprises:
Removing the masking elements,
Forming a second passivation layer (13) conformally over a construction obtained after the method step calling for physically disconnecting a first part,
Forming a further dielectric layer over the second passivation layer (13),
Planarizing (e.g., by chemical mechanical planarization) the top surface of the structure obtained in g2 until a top surface of the second passivation layer (13) is exposed, and
Planarizing further until the first part (8') of the top III-V layer (8) is exposed.

In embodiments, the III-V semiconductor construction may be a field-effect transistor (e.g., an HEMT) and the method may comprise performing the further processing steps, performed either between the method step calling for physically disconnecting a first part and the method step calling for contacting the sacrificial second III-V structure or after the method step calling for contacting the sacrificial second III-V structure, of exposing the first part (8') of the third III-V structure (7, 7', 7", 8), and forming a source (20), a drain (21), and a gate stack (14, 16) thereon. The gate stack typically comprises a gate dielectric (14) and a gate metal (16). Spacers (15) on either side of the gate stack are typically present.

Figure 4:
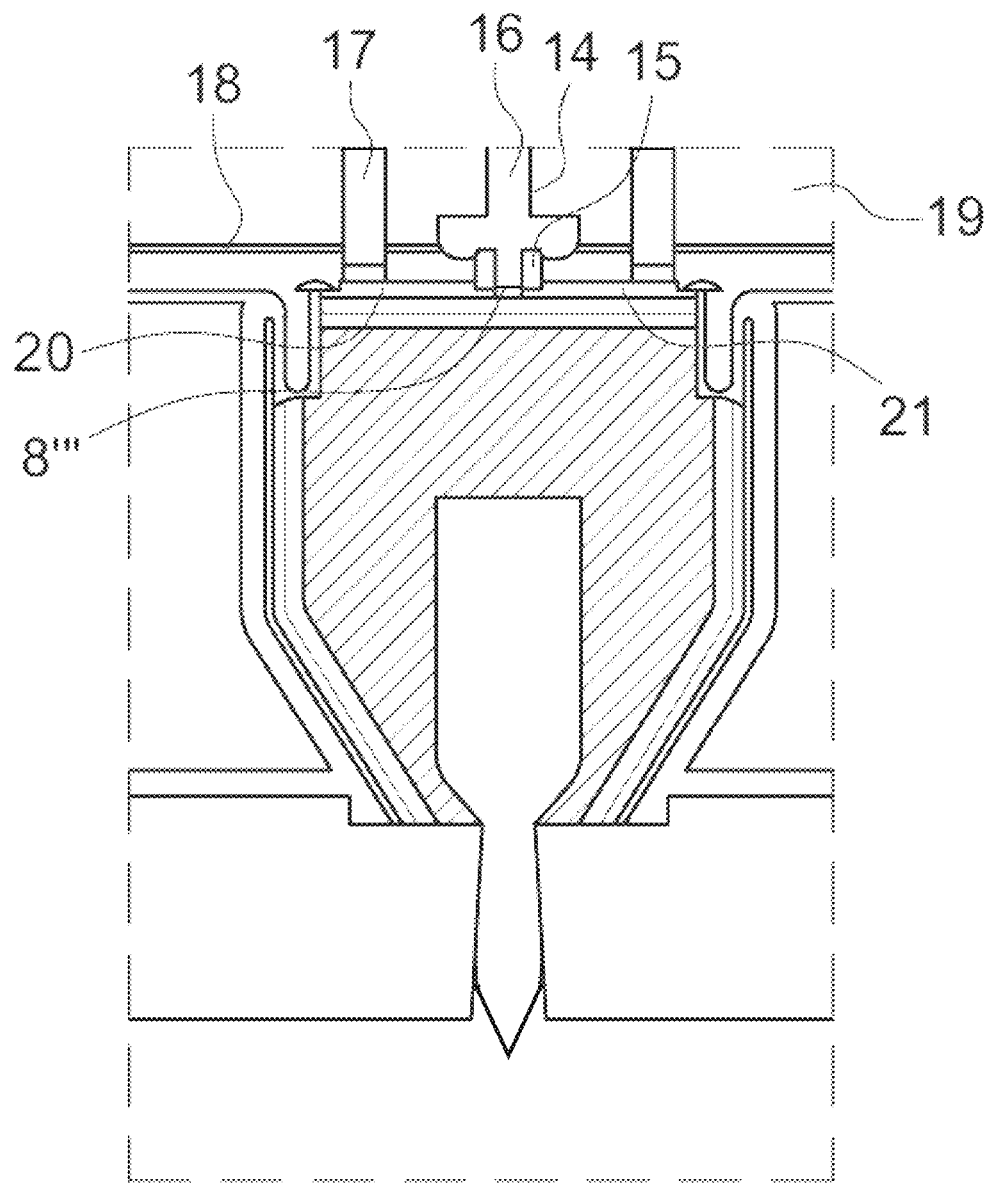
Figure 5:
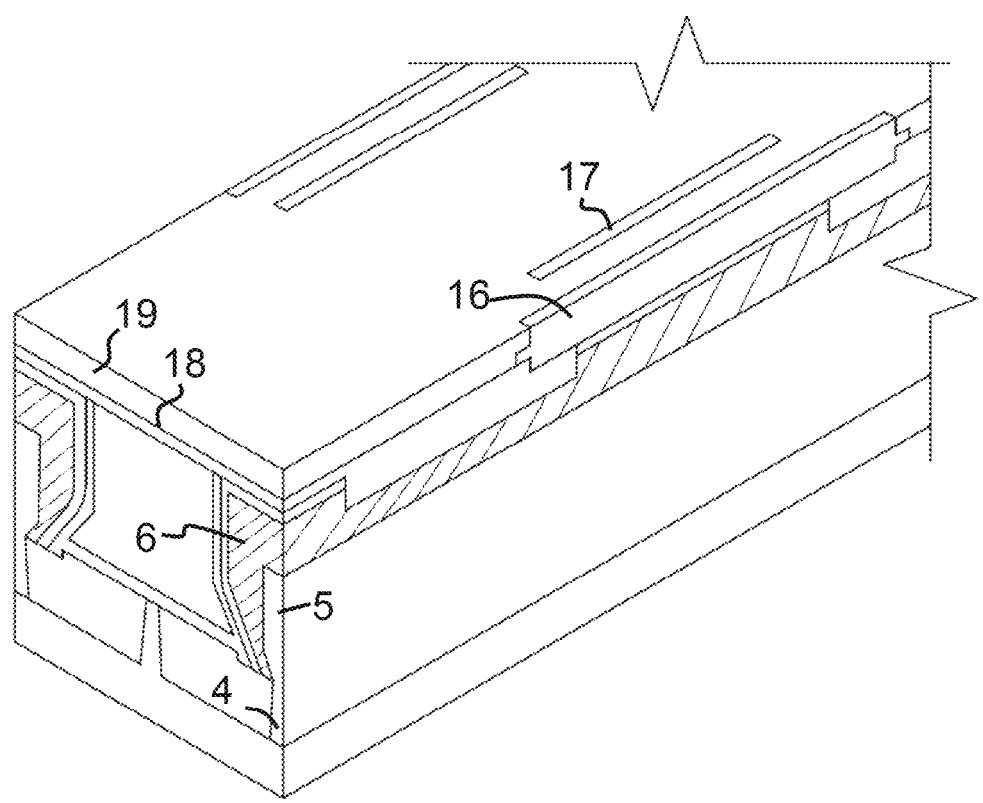
FIG. 5 is a schematic representation of a perspective view of the intermediate structure depicted in FIG. 4, in accordance with example embodiments.

FIGS. 4 and 5 show an example of a construction according to an embodiment after performing further processing steps and before the method step calling for contacting the sacrificial second III-V structure.

In embodiments, the further processing steps may comprise the steps of:
- Forming a dummy gate on the first part of the top III-V layer,
- Forming spacers on sidewalls of the dummy gate,
- Growing on the first part of the top layer a source (20) on one side of the dummy gate and a drain (21) on the other side of the dummy gate,
- Replacing the dummy gate by a metal gate, and
- Forming contacts (17) to the source (20), the drain (21), and the metal gate.

In an example, the processing steps are performed after the method step calling for physically disconnecting a first part and before the method step calling for contacting the sacrificial second III-V structure.

In an example, the processing steps are performed after the method step calling for contacting the sacrificial second III-V structure only if it is also performed after filling of a cavity (23) with a dielectric material (24) (see infra). In an example, filling up the cavity (23) with a dielectric material (24) first improves mechanical stability, which better facilitates the formation of the source (20)/drain (21) and gate.

In embodiments, the gate may have a T-shape.

In FIGS. 4 and 5, a further passivation layer (18) and a further dielectric layer (19) used to pattern the top gate and to achieve the "T-shape" is used.

In the method step calling for contacting the sacrificial second III-V structure, the sacrificial second III-V structure (6) is contacted with the liquid etching medium, thereby selectively etching the sacrificial second III-V structure (6) with respect to the first III-V structure and the bottom layer, thereby forming a cavity (23).

In embodiments, the method step calling for contacting the sacrificial second III-V structure may comprise the following steps:
- Exposing the sacrificial second III-V structure (6), and
- Contacting the sacrificial second III-V structure (6) with the liquid etching medium, thereby selectively etching the sacrificial second III-V structure (6) with respect to the first III-V structure and the bottom layer, thereby forming a cavity (23).

Figure 6:
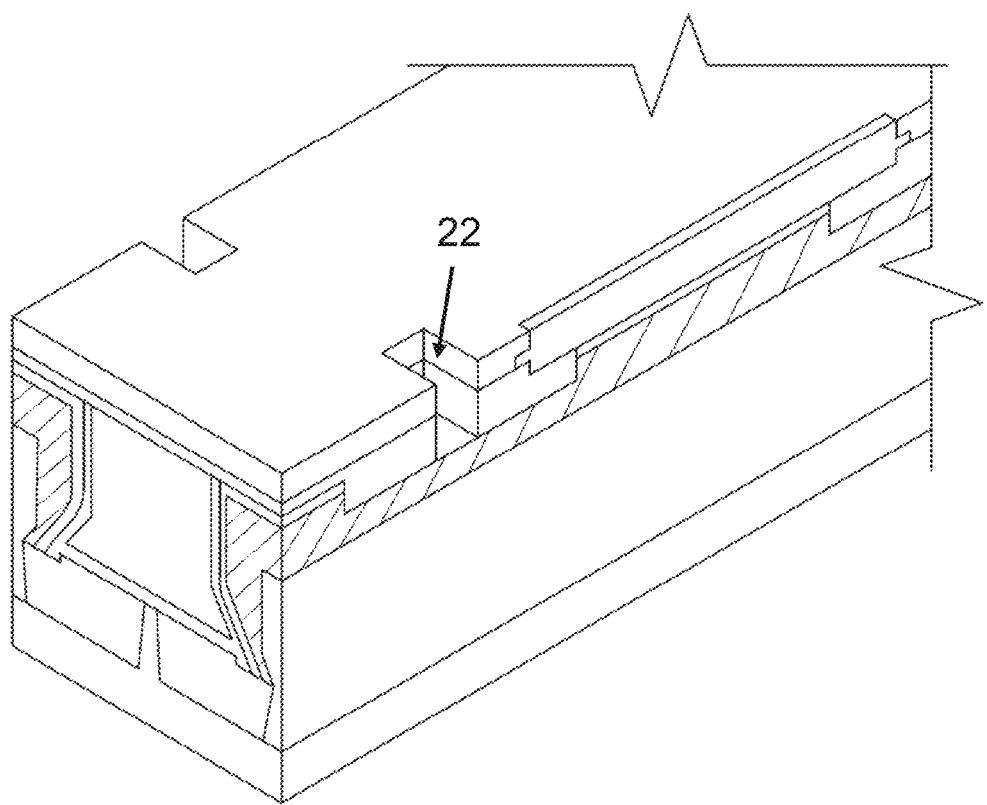
FIG. 6 is a schematic representation of a perspective view of the intermediate structure, in accordance with example embodiments.

An example of a structure resulting from performing the method step calling for exposing the sacrificial second III-V structure can be found in FIG. 6.

Figure 7:
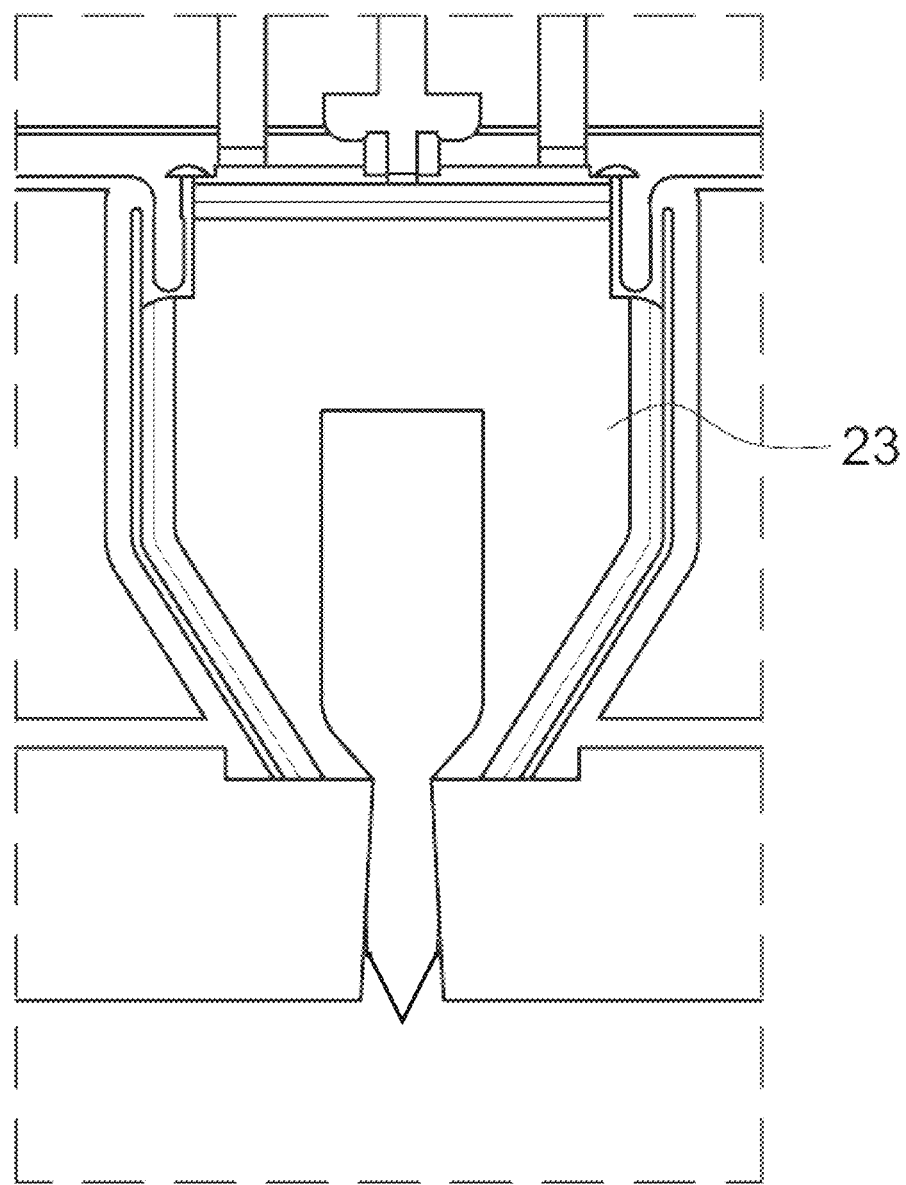

An example of a structure resulting from performing the method step calling for contacting the sacrificial second III-V structure (6) with the liquid etching medium can be found in FIG. 7.

In embodiments, the method may further comprise filling the cavity (23) with a dielectric material (24) after the method step calling for contacting the sacrificial second III-V structure. This further improves the mechanical stability of the device.

Figure 8:
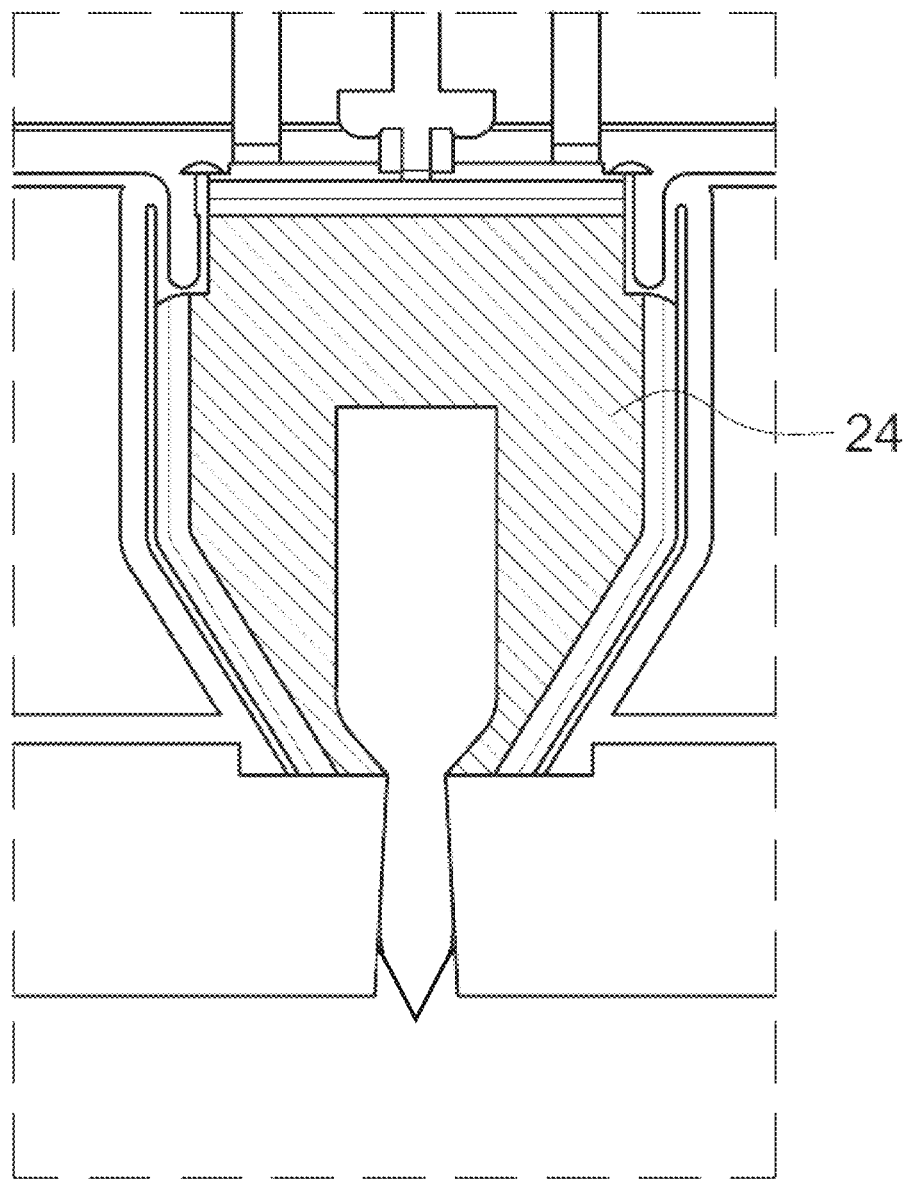

An example of a structure resulting from filling the cavity (23) with a dielectric material can be found in FIG. 8.

Figure 9:
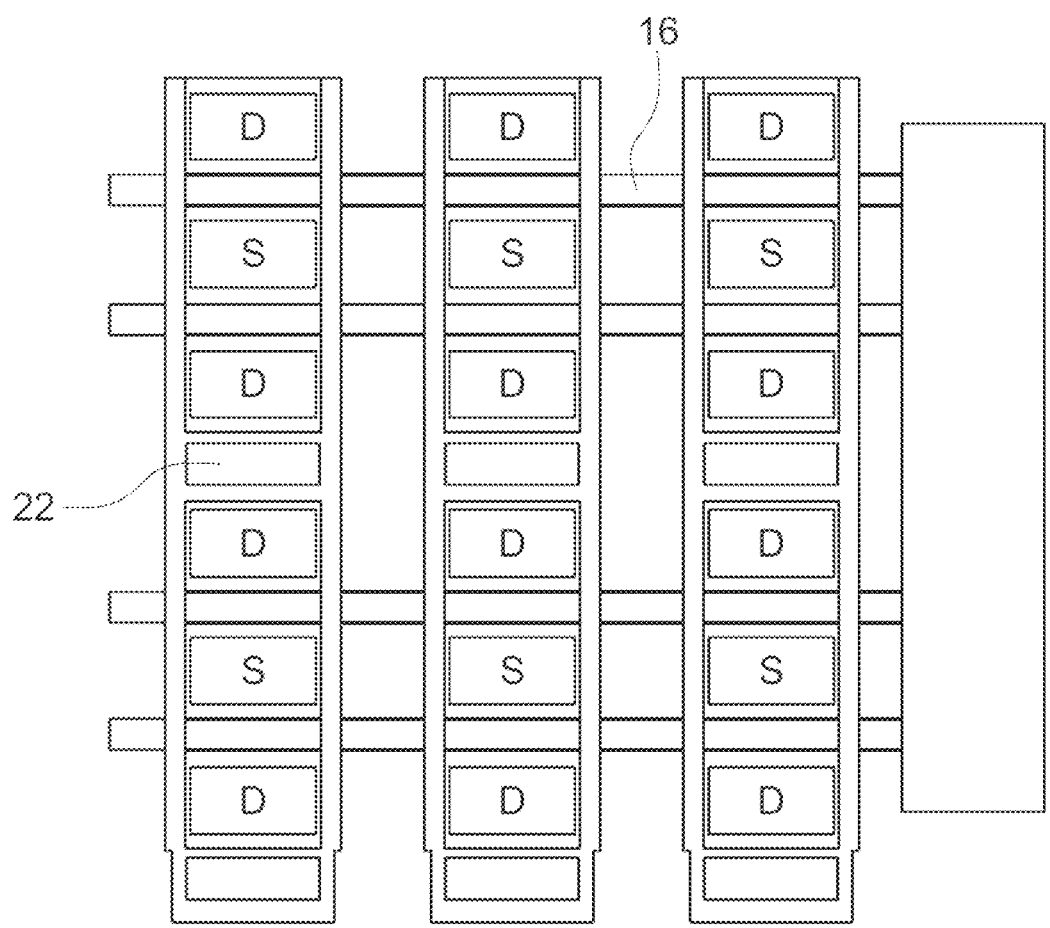
Figure 10:
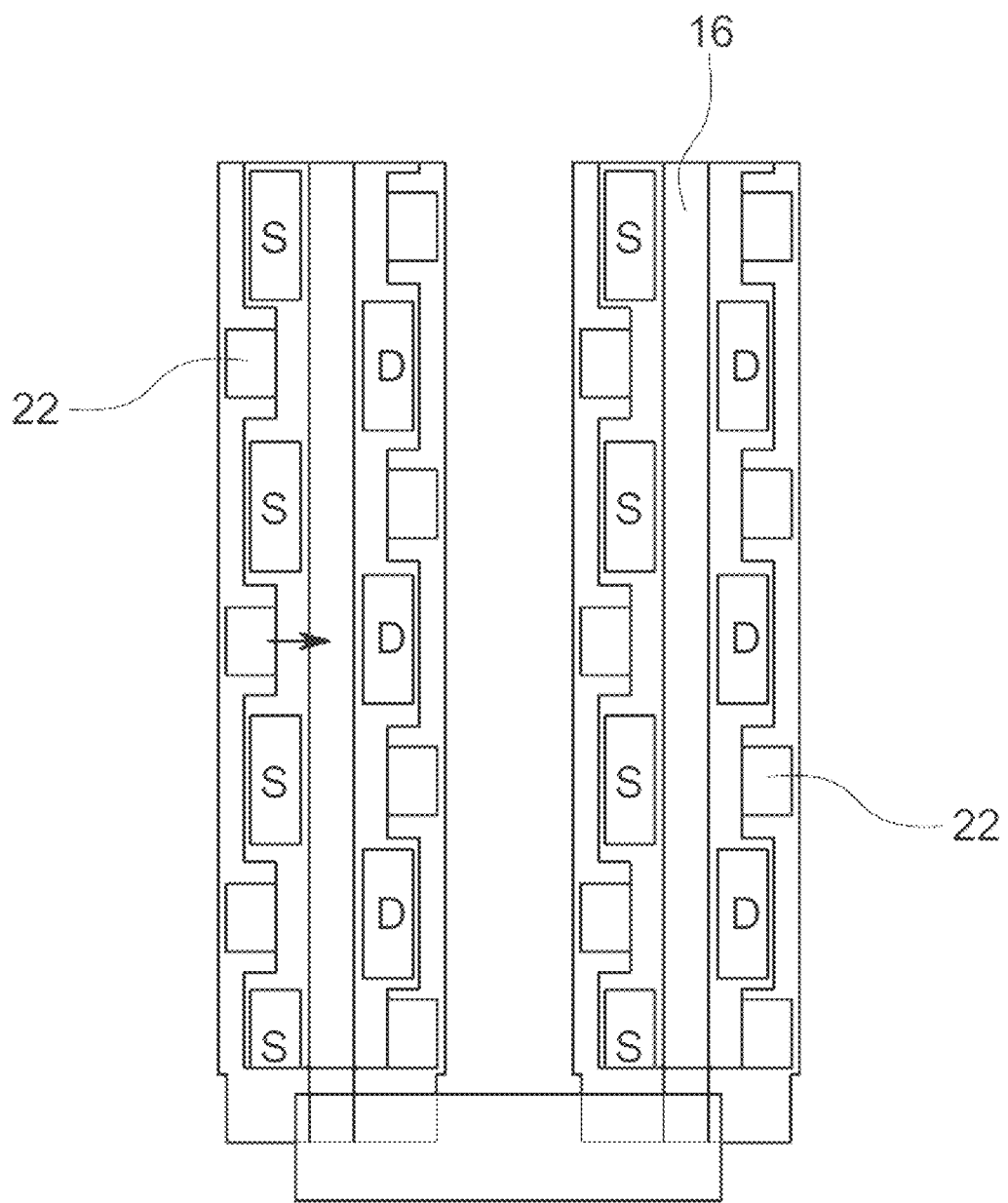

FIGS. 9 and 10 show, in the case of multiple transistors (e.g., HEMTs) being formed by the method, two different layout strategies that facilitate access to the sacrificial second III-V structure (6) in order to contact it with the liquid etching medium. Many other possible layers exist. As a general rule, access to the sacrificial second III-V structure (6) is formed outside of the transistors, for instance, in an area present between transistors. In these figures, gates and access points (22) where the sacrificial second III-V structure (6) is exposed are identified.

A second aspect relates to a III-V semiconductor construction comprising:
a. an assembly comprising a monocrystalline group IV substrate (1) and a first dielectric layer (2) thereon, the first dielectric layer (2) comprising a trench having a bottom exposing the group IV substrate (1),
b. a first III-V structure comprising a bottom part (4) inside the trench and a top part (5) out of the trench on top of the bottom part (4),
c. a cavity (23) or a dielectric structure on the top part (5) of the first III-V structure,
d. a third III-V structure (7, 7', 7", 8) on the cavity (23) or dielectric structure, the third III-V structure (7, 7', 7", 8) comprising a bottom III-V layer (7) on the cavity (23) or dielectric structure, and a top III-V layer comprising a first part (8') physically disconnected from a second part (8").

In embodiments, the top part (5) may be wider than the bottom part (4).

In embodiments, the III-V semiconductor construction may be obtainable by any embodiments of the first aspect.

Features of the second aspect also described in the first aspect may be as correspondingly described therein.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for forming a group III-V semiconductor construction over a monocrystalline group IV substrate comprising:
   providing an assembly in an epitaxial growth chamber, the assembly comprising the monocrystalline group IV substrate and a first dielectric layer thereon, the first dielectric layer comprising a trench having a bottom that exposes the group IV substrate;
   initiating growth of a first III-V structure in the trench to thereby form a bottom part of the first III-V structure inside the trench;
   continuing growth out of the trench on top of the bottom part to thereby form a top part of the first III-V structure;
   epitaxially growing a sacrificial second III-V structure on the top part of the first III-V structure, the sacrificial second III-V structure being selectively etchable with respect to the first III-V structure in a liquid etching medium;
   epitaxially growing a third III-V structure on the sacrificial second III-V structure, the third III-V structure comprising:
      a bottom III-V layer on the sacrificial second III-V structure, wherein the sacrificial second III-V structure is selectively etchable with respect to the bottom III-V layer in the liquid etching medium; and
      a top III-V layer;
   physically disconnecting a first part of the top layer of the third III-V structure from a second part thereof; and
   contacting the sacrificial second III-V structure with the liquid etching medium to thereby selectively etch the sacrificial second III-V structure with respect to the first III-V structure and the bottom layer to thereby form a cavity.

2. The method according to claim 1, wherein the monocrystalline group IV substrate is a monocrystalline silicon substrate.

3. The method according to claim 2, wherein the group IV substrate exposed at the bottom of the trench is V-shaped.

4. The method according to claim 1, wherein the group IV substrate exposed at the bottom of the trench is V-shaped.

5. The method according to claim 1, wherein the first III-V structure comprises $In_xGa_{1-x}As_zE_{1-z}$, wherein x is within the range 0 and 1, z is within the range 0 and 1, and E is selected from P, Sb, and N.

6. The method according to claim 1, wherein the sacrificial second III-V structure comprises InP.

7. The method according to claim 1, wherein the bottom III-V layer comprises at least one of: $In_yAl_{1-y}As$, wherein y is from 0.51 to 0.53 or $In_wGa_{1-w}As$, wherein w is from 0.52 to 0.54.

8. The method according to claim 7, wherein the third III-V structure comprises:
 a bottom first $In_yAl_{1-y}As$ layer;
 an $In_wGa_{1-w}As$ layer on the bottom first $In_yAl_{1-y}As$ layer;
 a second $In_yAl_{1-y}As$ layer over and on the $In_wGa_{1-w}As$ layer to thereby sandwich the $In_wGa_{1-w}As$ layer between two $In_yAl_{1-y}As$ layers; and
 a top InP layer on the second $In_yAl_{1-y}As$ layer.

9. The method according to claim 7, wherein the top III-V layer comprises InP.

10. The method according to claim 9, wherein the third III-V structure comprises:
 a bottom first $In_yAl_{1-y}As$ layer;
 an $In_wGa_{1-w}As$ layer on the bottom first $In_yAl_{1-y}As$ layer;
 a second $In_yAl_{1-y}As$ layer over and on the $In_wGa_{1-w}As$ layer to thereby sandwich the $In_wGa_{1-w}As$ layer between two $In_yAl_{1-y}As$ layers; and
 a top InP layer on the second $In_yAl_{1-y}As$ layer.

11. The method according to claim 10, wherein the III-V semiconductor construction is a field-effect transistor and wherein after physically disconnecting the first part of the top layer of the third III-V structure from the second part thereof, and before contacting the sacrificial second III-V structure with the liquid etching medium the method comprises:
 exposing the first part of the top layer of the third III-V structure; and
 forming a source, a drain, and a gate stack thereon.

12. The method according to claim 1, wherein the III-V semiconductor construction is a field-effect transistor and wherein after physically disconnecting the first part of the top layer of the third III-V structure from the second part thereof, and before contacting the sacrificial second III-V structure with the liquid etching medium the method comprises:
 exposing the first part of the top layer of the third III-V structure; and
 forming a source, a drain, and a gate stack thereon.

13. The method according to claim 12, wherein the field-effect transistor is a high-electron-mobility transistor.

14. The method according to claim 1, wherein the III-V semiconductor construction is a field-effect transistor and wherein after contacting the sacrificial second III-V structure with the liquid etching medium, the method comprises:
 exposing the first part of the top layer of the third III-V structure; and
 forming a source, a drain, and a gate stack thereon.

15. The method according to claim 1, wherein the top III-V layer comprises InP.

16. The method according to claim 1, wherein after contacting the sacrificial second III-V structure with the liquid etching medium the method further comprises:
 filling the cavity with a dielectric material.

17. The method according to claim 1, wherein a temperature in the chamber is set to 400° C. or higher when the top part is growing out of the trench.

18. The method according to claim 1, wherein at least one surfactant is added in the chamber when the top part is growing out of the trench.

* * * * *